(12) United States Patent
Hano

(10) Patent No.: US 12,062,991 B2
(45) Date of Patent: Aug. 13, 2024

(54) POWER CONVERSION DEVICE

(71) Applicant: TMEIC Corporation, Chuo-ku (JP)

(72) Inventor: Mitsuru Hano, Tokyo (JP)

(73) Assignee: TMEIC Corporation, Chuo-ku (JP)

( * ) Notice: Subject to any disclaimer, the term of this patent is extended or adjusted under 35 U.S.C. 154(b) by 251 days.

(21) Appl. No.: 17/602,378

(22) PCT Filed: Nov. 7, 2019

(86) PCT No.: PCT/JP2019/043646
§ 371 (c)(1),
(2) Date: Oct. 8, 2021

(87) PCT Pub. No.: WO2021/090437
PCT Pub. Date: May 14, 2021

(65) Prior Publication Data
US 2022/0166338 A1    May 26, 2022

(51) Int. Cl.
*H05K 5/02* (2006.01)
*H02M 7/00* (2006.01)
*H02M 7/537* (2006.01)
*H02P 27/06* (2006.01)

(52) U.S. Cl.
CPC ........... *H02M 7/003* (2013.01); *H02M 7/537* (2013.01); *H05K 5/0221* (2013.01); *H02P 27/06* (2013.01)

(58) Field of Classification Search
CPC ..... H02M 7/003; H02M 7/537; H05K 5/0221
See application file for complete search history.

(56) References Cited

FOREIGN PATENT DOCUMENTS

| EP | 2 675 054 A1 | 12/2013 | |
|---|---|---|---|
| JP | 6-339283 A | 12/1994 | |
| JP | H06339283 | * 12/1994 | .............. H02M 7/48 |
| JP | 2007-129838 A | 5/2007 | |
| JP | 2012-169342 A | 9/2012 | |
| JP | 2012169342 | * 9/2012 | ........... Y02E 10/549 |
| JP | 2019-88113 A | 6/2019 | |

OTHER PUBLICATIONS

Office Action issued Jun. 13, 2022, in corresponding Indian Patent Application No. 202017027636 (with English Translation), 8 pages.
International Search Report mailed on Dec. 17, 2019 in PCT/JP2019/043646 filed on Nov. 7, 2019 (2 pages).

* cited by examiner

*Primary Examiner* — Mukundbhai G Patel
(74) *Attorney, Agent, or Firm* — Oblon, McClelland, Maier & Neustadt, L.L.P.

(57) ABSTRACT

In a power conversion device, an incorrect mounting suppressing mechanism provided on a housing and an inverter module restricts movement of the inverter module with respect to the housing in a first direction. The inverter module includes a switch that moves between an OFF position at which a connection between a bus bar and a terminal can be cut off and an ON position at which a connection between the bus bar and the terminal can be made. The incorrect mounting suppressing mechanism includes a stopper on the housing and an interference member connected to the switch that moves between the restriction position and the retracting position as the switch moves. The restriction position overlaps the stopper viewed from the first direction when the switch is in the ON position. The retracting position retracts from the stopper viewed from the first direction when the switch is in the OFF position.

3 Claims, 12 Drawing Sheets

POWER CONVERSION DEVICE

TECHNICAL FIELD

Embodiments of the present invention relate to a power conversion device.

BACKGROUND ART

As a power conversion device, a configuration in which a plurality of inverter units on which electronic components are mounted are housed in a single panel (housing) is known.

However, in the conventional power conversion device, there is still room for improvement in suppressing incorrect mounting of each inverter unit.

PRIOR ART DOCUMENTS

Patent Document

[Patent Document 1]
Japanese Unexamined Patent Application, First Publication No. 2007-129838

SUMMARY OF INVENTION

Problems to be Solved by the Invention

The problem to be solved by the present invention is to provide a power conversion device that can suppress incorrect mounting.

Means for Solving the Problems

The power conversion device according to the embodiment has a housing, an inverter module, and an incorrect mounting suppressing mechanism. The housing has an opening that opens in the first direction, and a bus bar is routed inside. The inverter module is configured to be detachable from the housing through the opening, and has a terminal connected to the bus bar at a mounting position mounted on the housing. The incorrect mounting suppressing mechanism is provided in the housing and the inverter module, and restricts movement of the inverter module in the first direction with respect to the housing. The inverter module has a switch that moves between an OFF position at which a connection between the bus bar and the terminal can be cut off and an ON position at which the connection between the bus bar and the terminal can be made. The incorrect mounting suppressing mechanism has a stopper and an interference member. The stopper is provided on the housing. The interference member is connected to the switch, and moves between the restriction position and the retracting position as the switch moves. The restriction position overlaps the stopper when viewed from the first direction in a state where the switch is in the ON position. The retracting position retracts from the stopper when viewed from the first direction in a state where the switch is in the OFF position.

DESCRIPTION OF EMBODIMENTS

Figure 1:
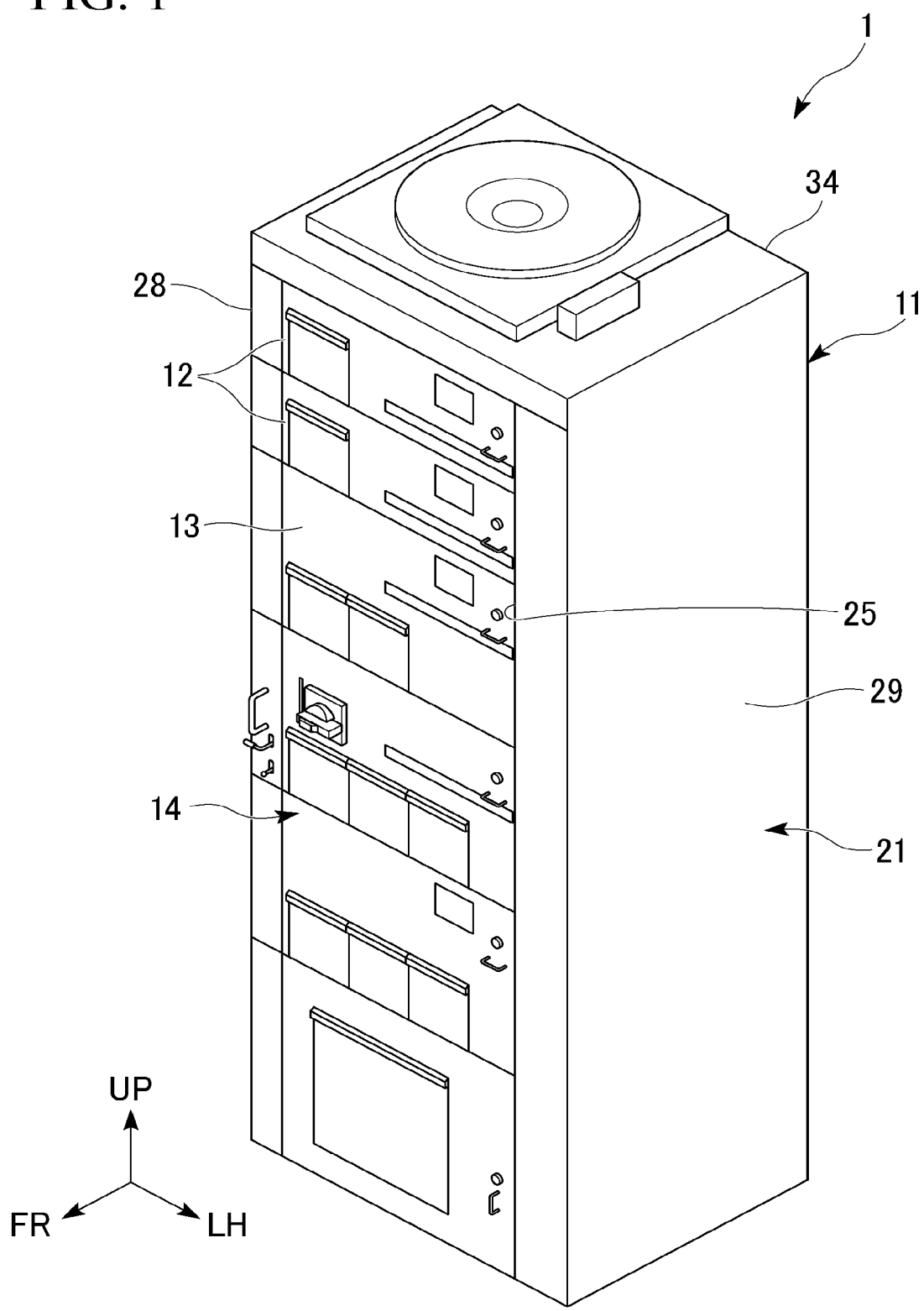
FIG. 1 is an exemplary perspective view showing a power conversion device according to an embodiment.

Hereinafter, a power conversion device according to an embodiment will be described with reference to the drawings. In the following description, components having the same or similar functions are denoted by the same reference numerals, and overlapping descriptions between the components may be omitted. In the following description, the normal direction of the installation surface F on which the power conversion device 1 is installed is defined as the up-down direction (the arrow UP is upward), and the directions perpendicular to the up-down direction are referred to as the front-rear direction (first direction: the arrow FR indicates the front of the device) and the left-right direction (the arrow LH indicates the left side of the device). In the following description, for example, the expression indicating a relative or absolute arrangement such as "parallel", "orthogonal", "center", "coaxial", or the like represents not only such an arrangement strictly but also a state of being relatively displaced with an angle or distance that can achieve a tolerance or the same function.

FIG. 1 is a perspective view of the power conversion device 1.

The power conversion device 1 shown in FIG. 1 is a device applied to, for example, a drive system that drives a motor. The power conversion device 1 converts DC power supplied from an external power supply into AC power (three-phase AC) and outputs the power to the motor. The power conversion device 1 may be a device applied to a system other than the drive system. The power conversion device 1 may be a device that converts AC power into DC power. The power conversion device 1 may be a device that converts certain power into another power having a different frequency or voltage.

The power conversion device 1 is formed in a box shape whose longitudinal direction is the vertical direction. The power conversion device 1 includes a main unit 11, inverter units 12 to 14, an incorrect mounting suppressing mechanism 15 (see FIG. 5), an incorrect operation suppressing mechanism 16 (see FIG. 5), and a positioning mechanism 17 (see FIG. 8).

Figure 2:
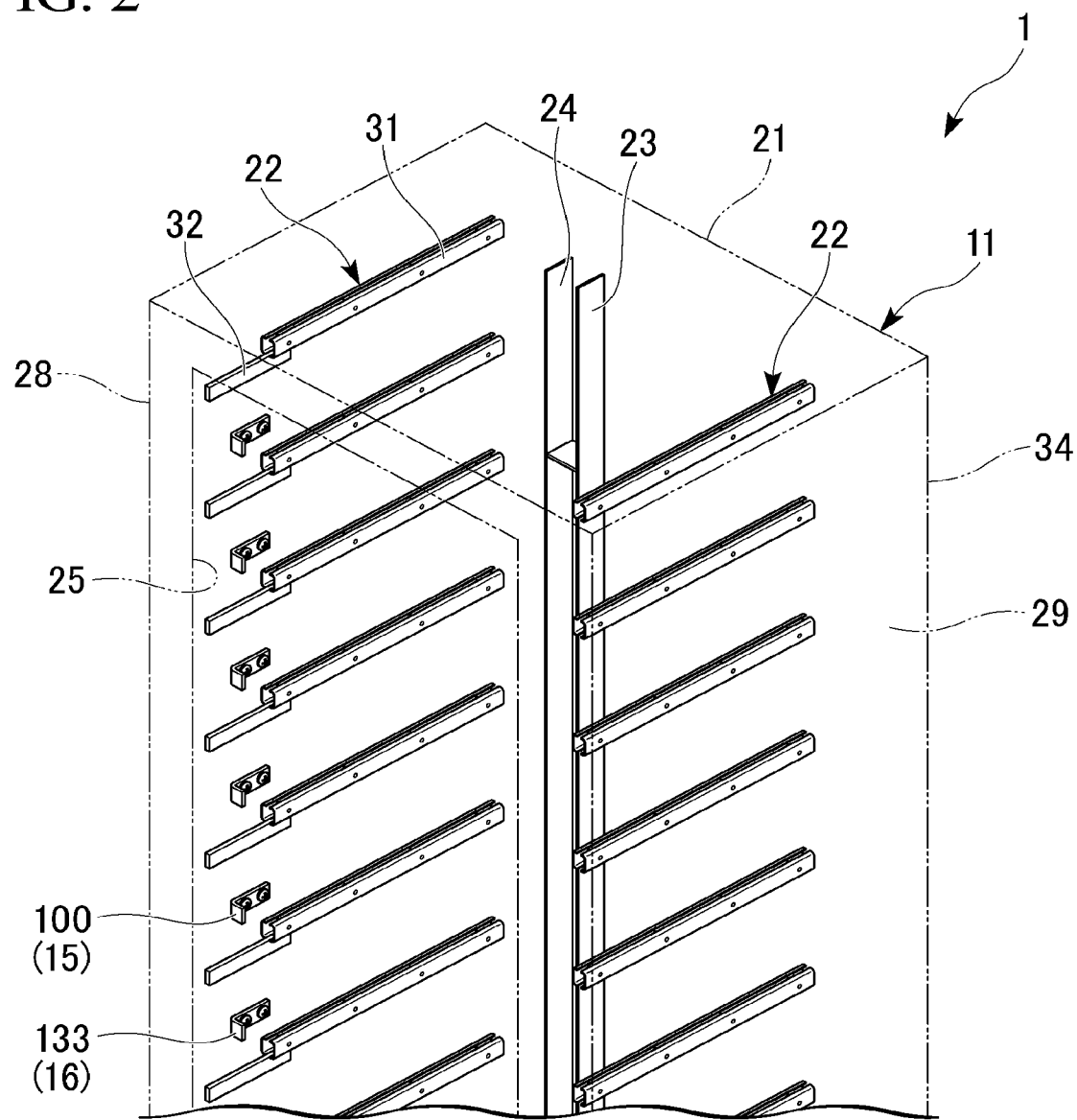
FIG. 2 is a perspective view of a main body unit showing a state of being transmitted through a housing.

FIG. 2 is a perspective view of the main unit 11 showing a state of being transmitted through the housing 21.

As shown in FIGS. 1 and 2, the main body unit 11 includes a housing 21, a unit support mechanism 22, and bus bars 23 and 24.

The housing 21 is formed in a box shape having an opening 25 that opens forward. A main controller or the like that controls the operation of the power conversion device 1 is mounted on a lower portion in the housing 21.

As shown in FIG. 2, the unit support mechanism 22 is provided as a pair on the inner surfaces of the left and right side walls 28 and 29 of the housing 21. The unit support mechanism 22 includes a rail 31 and a slider 32, respectively. The rail 31 extends in the front-rear direction on the inner surfaces of the side walls 28 and 29. The slider 32 is supported by the rail 31 so as to be slidable in the front-rear direction. Therefore, the slider 32 is configured to be able to advance and retract to the housing 21 through the opening 25. The unit support mechanism 22 is provided on each of the side walls 28 and 29 at intervals in the vertical direction. In the present embodiment, a plurality of pairs (for example, eight pairs) of a pair of left and right unit support mechanisms 22 are provided at intervals in the vertical direction. The number of unit support mechanisms 22 can be changed as appropriate.

The bus bars 23 and 24 are provided on the inner surface of the rear wall 34 of the housing 21. The bus bars 23 and 24 extend in the vertical direction on the inner surface of the rear wall 34 with an interval in the horizontal direction. The bus bars 23 and 24 are connected to an external power supply via a DC common bus bar (not shown) at the lower portion of the housing 21.

As shown in FIG. 1, the inverter units 12 to 14 are configured to be detachable from the housing 21 by being inserted and removed through the opening 25. In the present embodiment, the inverter units 12 to 14 are a small unit 12, a middle unit 13 and a large unit 14 having different heights in the vertical direction. The types of the inverter units 12 to 14 that are attached to and detached from the housing 21 can be appropriately changed. In the following description, the details of the inverter unit will be described using the large unit 14 as an example.

Figure 3:
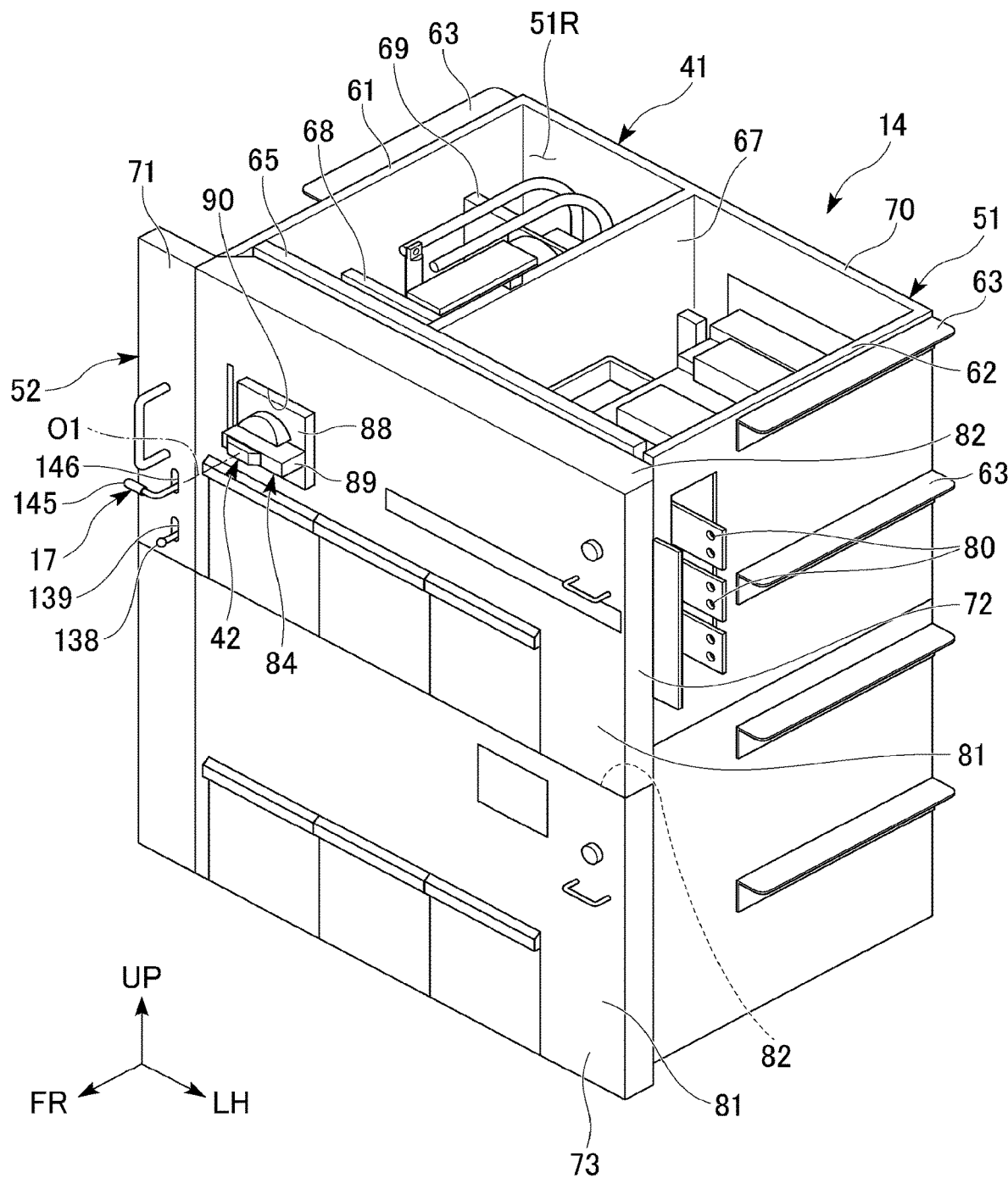
FIG. 3 is a perspective view of a large unit.

FIG. 3 is a perspective view of the large unit 14.

As shown in FIG. 3, the large unit 14 is formed in a box shape having a height of, for example, four sets of unit support mechanisms 22 (half of the opening 25). The large unit 14 includes a unit housing 41, a switch 42, a power conversion circuit (not shown), and terminals 43 and 44 (see FIG. 5). The size and the like of the large unit 14 can be appropriately changed.

The unit housing 41 includes an accommodation portion 51 and a door mechanism 52. The accommodation portion 51 is formed in a box shape that opens forward and upward. On the left and right side walls 61 and 62 of the accommodation portion 51, overhang portions 63 protruding outward in the left and right direction are provided. The overhang portions 63 are formed in a plate shape extending in the front-rear direction with the vertical direction as the thickness direction. The overhang portions 63 are arranged on the side walls 61 and 62 with an interval in the vertical direction. A plurality of overhang portions 63 are provided in the up-down direction in pairs at the same height between the side walls 61 and 62. Each of the overhang portion 63 is detachably attached to the slider 32 described above. The large unit 14 is moved in the front-rear direction in accordance with the movement of the slider 32 in the front-rear direction with respect to the rail 31, and is inserted and removed from the housing 21 through the opening 25.

A first partition wall 65 that bridges between the left and right side walls 61 and 62 is provided at an upper portion in the accommodation portion 51. The first partition wall 65 partitions the inside of the accommodation portion 51 in the front-rear direction at the front portions of the side walls 61 and 62 (a portion located behind the opening edge of the front end of the accommodation portion 51).

The accommodation portion 51 is provided with a second partition wall 67 that partitions the upper portion of the accommodation portion 51 left and right. The second partition wall 67 bridges between the rear wall 70 of the accommodation portion 51 and the second partition wall 67 in the front-rear direction.

A shaft support wall (a first shaft support wall 68 and a second shaft support wall 69) is provided in a space 51R on the right side of the second partition wall 67 in the accommodation portion 51. The first shaft support wall 68 bridges between the side wall 61 and the second partition wall 67 at a central portion in the front-rear direction in the accommodation portion 51. The second shaft support wall 69 bridges between the side wall 61 and the second partition wall 67 at the rear end in the accommodation portion 51. The layout in the accommodation portion 51 can be changed as appropriate.

The door mechanism 52 is configured to be able to open and close the front end opening of the accommodation portion 51. The door mechanism 52 of the present embodiment includes a door support portion 71, an upper panel 72, and a lower panel 73.

The door support portion 71 is provided at a front end edge of the side wall 61 in the accommodation portion 51. The door support portion 71 protrudes outward (rightward) in the left-right direction from the front edge of the side wall 61. The door support portion 71 forms a front wall of the unit housing 41. The door support portion 71 may be divided in the vertical direction with respect to the height of the accommodation portion 51, or may be formed integrally.

The upper panel 72 and the lower panel 73 are provided side by side in the vertical direction in front of the accommodation portion 51. Each of the panels 72 and 73 is supported by the door support portion 71 so as to be rotatable around an axis extending in the up-down direction, and opens and closes the front end opening of the accommodation portion 51. In the present embodiment, each of the panels 72 and 73 includes a front portion 81 that forms a front wall of the unit housing 41 together with the door support portion 71, and a bent wall 82 that is bent rearward from the outer peripheral edge of the front portion 81. Each of the panels 72 and 73 may be integrally rotatable.

The power conversion circuit is mainly housed in the lower portion of the accommodation portion 51. The power conversion circuit includes a precharge circuit, a main circuit, and the like. Each circuit is configured by electrically connecting a switching element, a smoothing capacitor, a diode, and the like. For example, an IGBT (Insulated Gate Bipolar Transistor) or the like is used as the switching element. The AC power converted by the power conversion circuit is output through an output terminal 80 protruding from the side wall 62.

Figure 4:
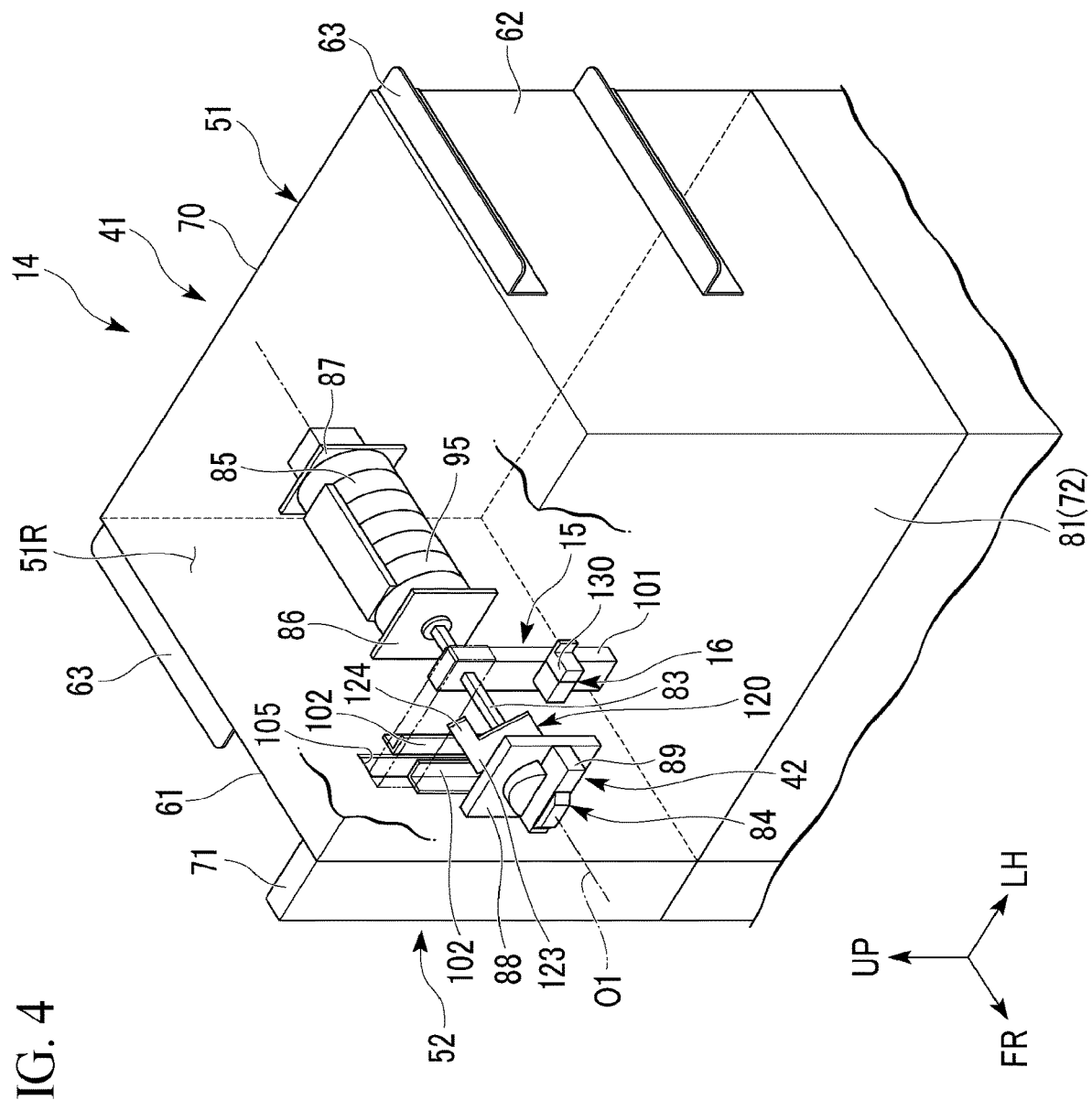
FIG. 4 is a schematic perspective view of the large unit.

FIG. 4 is a schematic perspective view of the large unit 14.

As shown in FIG. 4, the switch 42 is housed in the right side pace 51R with respect to the second partition wall 67 in the unit housing 41. The switch 42 switches the state of the large unit 14 to one of an ON state in which power is supplied to the motor, an OFF state in which power is not supplied to the motor, and a precharge state in which the smoothing capacitor is precharged. The switch 42 includes a shaft 83, an operating portion 84, and a connecting portion 85.

The shaft 83 is formed in a rod shape penetrating the upper panel 72, the first partition wall 65 (see FIG. 3) and the shaft support walls 68, 69 (see FIG. 3), and extending in the unit housing 41 in the front-rear direction. A first bearing portion 86 and a second bearing portion 87 are provided at the center and rear end of the shaft 83 in the front-rear direction. The first bearing portion 86 is fixed to the first shaft support wall 68 described above. The second bearing portion 87 is fixed to the second shaft support wall 69 described above. Thereby, the shaft 83 is configured to be rotatable around the first axis O1 along the front-rear direction.

The operating portion 84 includes a display panel 88 and a knob 89. The front end of the shaft 83 passes through the display panel 88. The display panel 88 is exposed to the outside of the unit housing 41 through an exposure hole 90 (see FIG. 3) formed in the front portion 81 of the upper panel 72 described above. On the front surface of the display panel 88, for example, "OFF" indicating that the large unit 14 is in an OFF state, "PRECHARGE" indicating that the large unit 14 is in a precharged state, and "ON" indicating that the large unit 14 is in an ON state are attached at intervals in the circumferential direction around the first axis O1.

The knob 89 is fixed to a portion of the front end of the shaft 83 that protrudes outside the unit housing 41. The knob 89 is configured to be capable of rotating the shaft 83 by being twisted around the first axis O1 while being gripped by the user.

The connecting portion 85 is provided in a portion of the shaft 83 located between the bearing portions 86 and 87 described above. The connecting portion 85 includes an insulator 95 and a contact block (not shown).

The insulator 95 is formed in a columnar shape arranged coaxially with the shaft 83. The insulator 95 is configured to be rotatable around the first axis O1 with the rotation of the shaft 83.

The contact blocks are provided on the insulator 95 at intervals in the front-rear direction and the circumferential direction around the first axis O1. Each contact block has a contact portion exposed on the outer peripheral surface of the insulator 95.

The plurality of contact blocks are configured to be connectable to the main circuit described above. That is, when the large unit 14 is properly mounted on the housing 21 (hereinafter referred to as a mounting position) and the knob 89 is in a position indicating "ON" (the switch 42 is in an ON position), the contact block is connected to the main circuit. As a result, the bus bars 23 and 24 are connected to the main circuit via the contact blocks. Some of the plurality of contact blocks constitute a precharge block that can be connected to a precharge circuit. The precharge block is connected to the precharge circuit when the large unit 14 is at the mounting position and the knob 89 is at the position indicating "PRECHARGE" (the switch 42 is at the precharge position). Thereby, the bus bars 23 and 24 and the precharge circuit are connected via the precharge block. When the large unit 14 is at the mounting position and the knob 89 is at the position indicating "OFF" (OFF position), none of the contact blocks are connected to the power conversion circuit. Thereby, the electric circuit between the bus bars 23 and 24 and the power conversion circuit is cut off.

Figure 5:
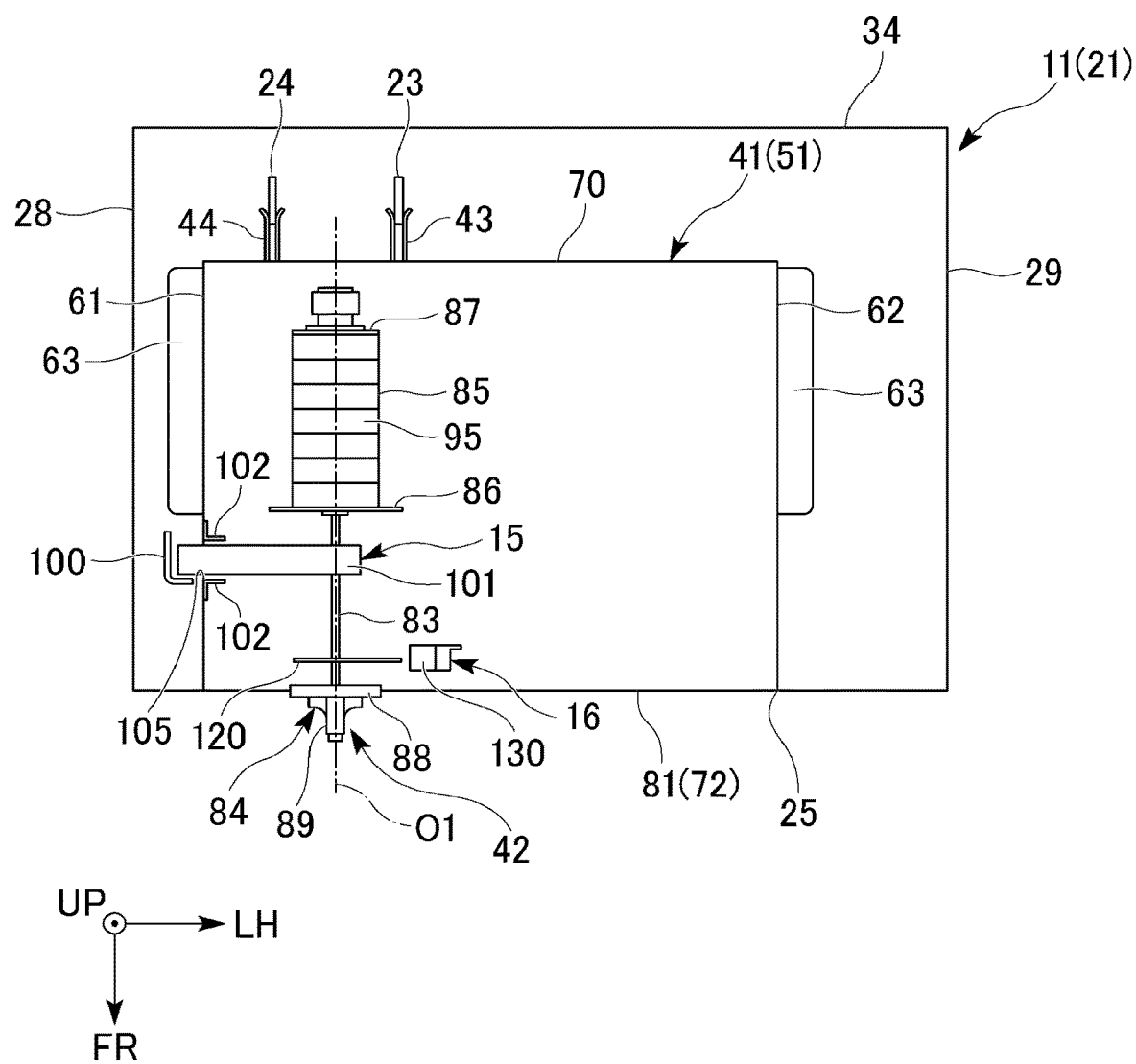
FIG. 5 is a schematic plan view showing a state where the large unit is at a mounting position.

FIG. 5 is a schematic plan view of the large unit 14.

As shown in FIG. 5, the terminals 43 and 44 protrude rearward from the rear wall 70 of the accommodation portion 51. The terminals 43 and 44 are arranged at intervals in the left-right direction. When the large unit 14 is at the mounting position, the terminals 43 and 44 are connected to the corresponding bus bars 23 and 24, respectively. In the present embodiment, each of the terminals 43 and 44 is formed in a forked shape that opens rearward. The bus bars 23 and 24 corresponding to the terminals 43 and 44 are fitted at the mounting position of the large unit 14. The bus bars 23 and 24 and the terminals 43 and 44 are not limited to fitting, but may be simple contacts as long as they are electrically connected.

The incorrect mounting suppressing mechanism 15 is a mechanism for preventing the switch 42 from being mounted on the housing 21 at the ON position, and preventing the switch 42 from being removed from the housing 21 at the ON position. The incorrect mounting suppressing mechanism 15 includes a stopper 100, an interference member 101, and a reinforcing portion 102.

The stopper 100 is attached to the inner surface of the side wall 28 in the housing 21. Specifically, the stopper 100 is formed in an L shape in plan view. The stopper 100 has a first end attached to the side wall 28 and a second end protruding inward in the left-right direction from the side wall 28. In this case, the protruding amount of the second end of the stopper 100 from the side wall 28 is such that the large unit 14 does not interfere with the side wall 61 of the unit housing 41 in a front view.

The interference member 101 is fixed to a portion of the shaft 83 of the switch 42 that is located between the first bearing portion 86 and the operating portion 84. That is, the interference member 101 is configured to be swingable around the first axis O1 in synchronization with the rotation of the switch 42. The interference member 101 cantileverly extends from the shaft 83 along a direction (extending direction) orthogonal to the first axis O1.

The orientation of the interference member 101 in a plane orthogonal to the first axis O1 changes according to the rotational position of the switch 42. Specifically, when the switch 42 is in the ON position, the interference member 101 protrudes outside the unit housing 41 through the communication hole 105 formed in the side wall 61 (restricted position: see a chain line in FIG. 4). When the large unit 14 is in the mounting position and the switch 42 is in the ON position, the front end of the interference member 101 (the portion protruding outside the unit housing 41) overlaps the second end portion of the stopper 100 from behind in front view. Accordingly, when the large unit 14 attempts to move forward with respect to the housing 21, the interference member 101 contacts (interferes) with the stopper 100 from behind, thereby restricting the forward movement of the large unit 14.

As shown in FIG. 4, the interference member 101 faces downward in the unit housing 41 when the switch 42 is in the OFF position. When the switch 42 is in the OFF position, the interference member 101 does not overlap with the stopper 100 in a front view by retracting from the communication hole 105 (retracting position). Therefore, when the interference member 101 is at the retracting position, the incorrect mounting suppressing mechanism 15 allows the large unit 14 to move forward with respect to the housing 21.

Figure 6:
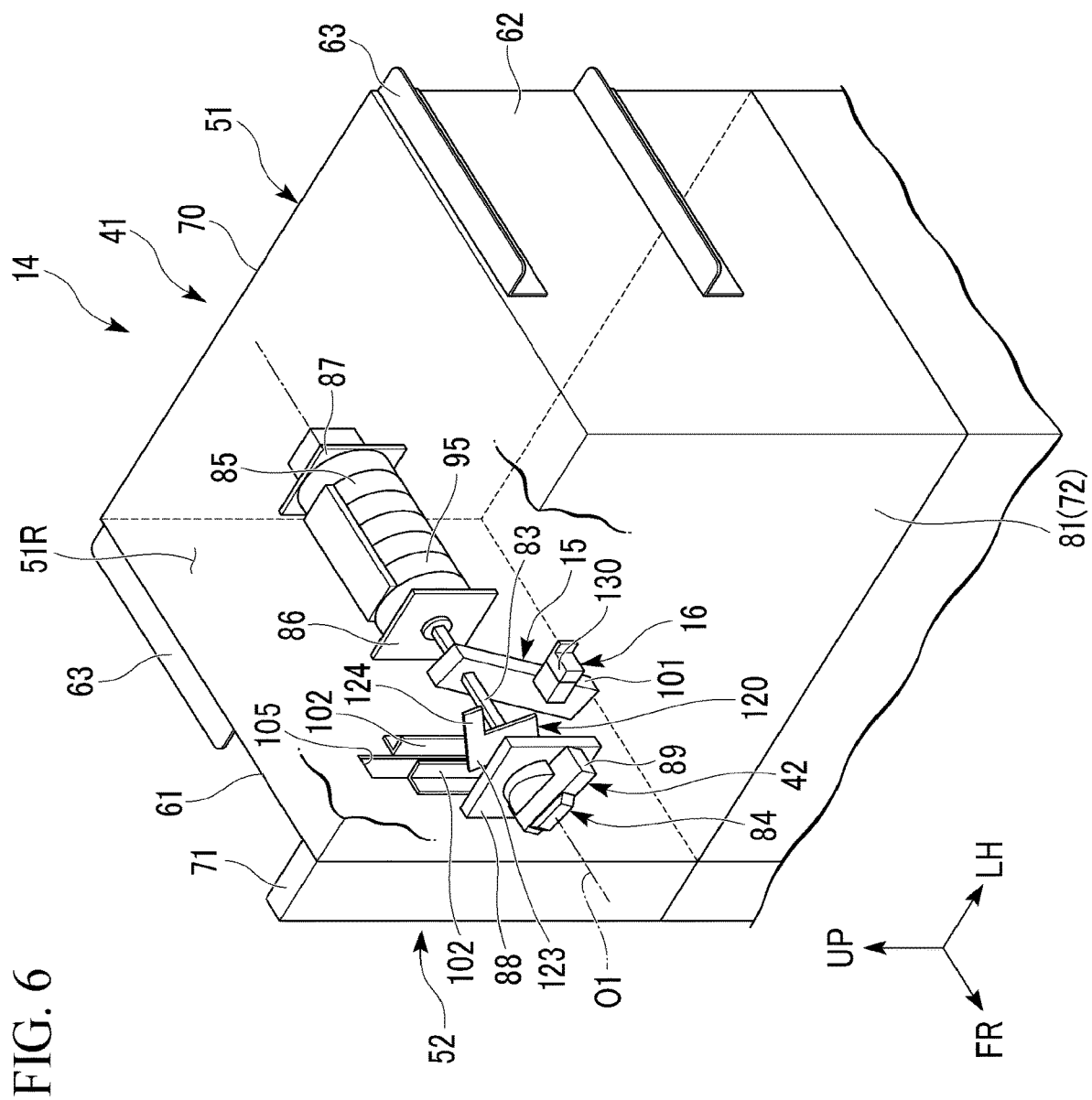
FIG. 6 is a schematic perspective view corresponding to FIG. 4 and showing a state where the switch is at a precharge position.

FIG. 6 is a schematic perspective view corresponding to FIG. 4, showing the switch 42 at the precharge position.

As shown in FIG. 6, when the switch 42 is at the precharge position, the interference member 101 is disposed between the restriction position and the retracting position. Specifically, when the switch 42 is at the precharge position, the interference member 101 faces obliquely downward in the unit housing 41 (intermediate position). Note that the interference member 101 may protrude outside the unit housing 41 or may be located inside the unit housing 41 as long as it does not interfere with the stopper 100 at the intermediate position. The interference member 101 only needs to be configured to interfere with the stopper 100 at least at the restricting position, and may be configured to interfere with the stopper 100 at the intermediate position.

The communication hole 105 described above may be formed at least on the swing locus of the interference member 101 from the retracting position to the restriction position in the side wall 61.

The reinforcing portion 102 protrudes into the unit housing 41 from both front and rear edges of the opening edge of the communication hole 105. Each reinforcing portion 102 is formed in a plate shape extending in the up-down direction with the front-rear direction being the thickness direction. Each reinforcing portion 102 guides the movement of the interference member 101 between the retracting position and the restricted position after restricting the displacement of the interference member 101 in the front-rear direction. The reinforcing portion 102 may be formed at any one of the opening edges of the communication hole 105 in the front-rear direction. The reinforcing portion 102 may be formed integrally with the unit housing 41 (side wall 61). The reinforcing portion 102 may protrude in any direction inside or outside the accommodation portion 51.

The incorrect operation suppressing mechanism 16 is a mechanism for preventing the switch 42 from moving from the OFF position to the ON position without performing precharge (before completion of precharge). The incorrect operation suppressing mechanism 16 includes a restricting member 120 and a lock portion 121.

The restricting member 120 is fixed to a portion of the shaft 83 located between the display panel 88 and the first partition wall 65. The restricting member 120 is configured to be able to swing around the first axis O1 in synchronization with the rotation of the switch 42. The restricting member 120 is formed in a plate shape having a thickness direction in the front-rear direction. The restricting member 120 includes a base portion 123 fixed to the shaft 83, and a protruding portion 124 protruding from the base portion 123 along a plane orthogonal to the first axis O1.

The lock portion 121 is a so-called solenoid. The lock portion 121 is configured such that a plunger 131 is supported by a main body portion 130 in which a coil and the like are stored so as to be able to advance and retract. The main body portion 130 is attached to the first partition wall 65 (see FIG. 3) at a position adjacent to the restricting member 120 on the left side.

Figure 7:
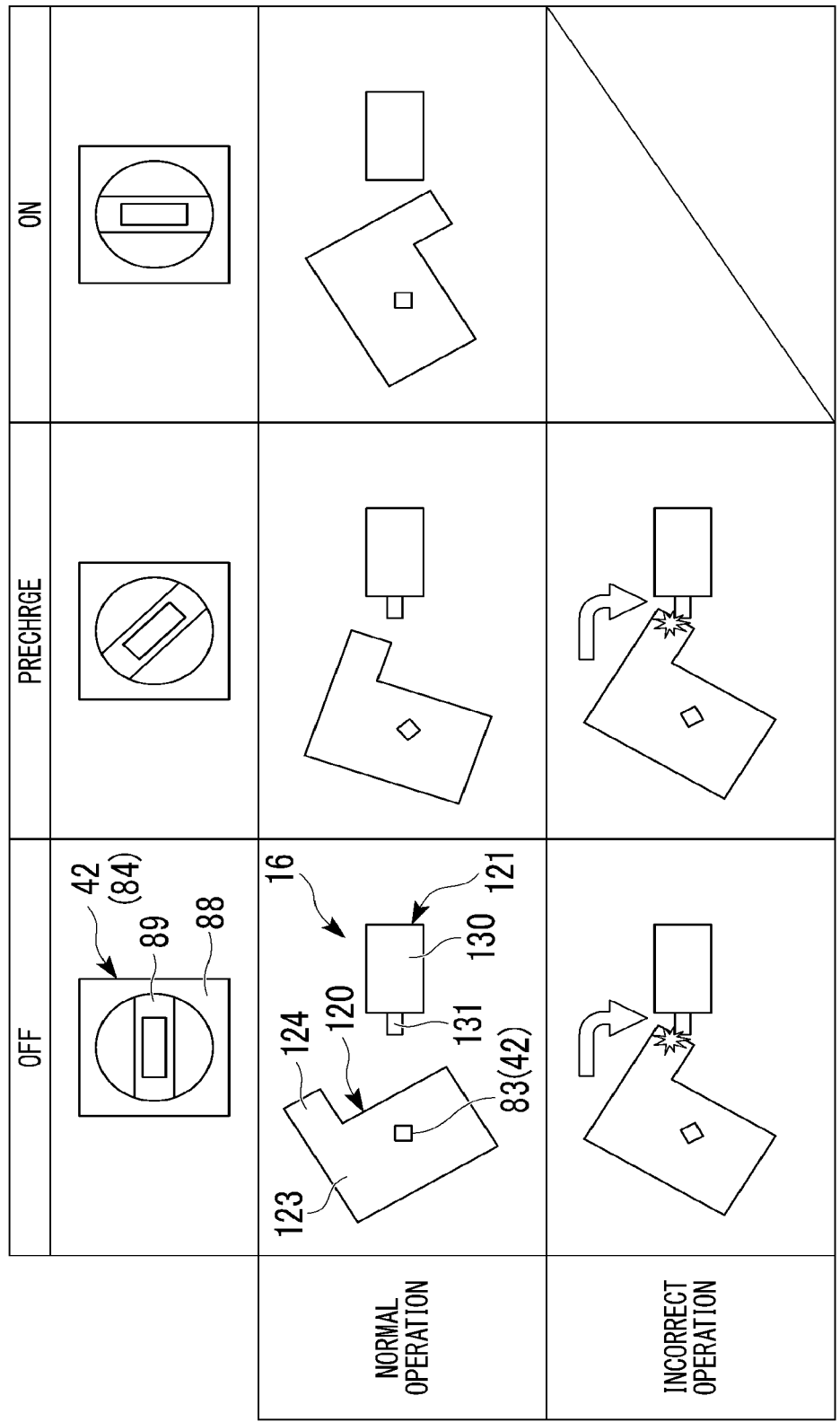
FIG. 7 is a diagram showing a relationship between an incorrect operation suppressing mechanism and an operating portion.

FIG. 7 is a diagram showing a relationship between the incorrect operation suppressing mechanism 16 and the operating portion 84.

As shown in FIG. 7, the plunger 131 is configured to be movable in the left-right direction by an electromagnetic force acting between the plunger 131 and the coil of the main body portion 130. The plunger 131 moves between a lock position located on the swing locus of the protruding portion 124 and an unlock position retracted from the swing locus of the protruding portion 124.

When the switch 42 shifts to the ON position without performing precharge in a state where the plunger 131 is at the lock position, the protruding portion 124 comes into contact in the circumferential direction around the first axis O1 before the switch 42 reaches the ON position. Thereby, the swinging operation of the restricting member 120 (the turning operation of the switch 42) is restricted.

When the plunger 131 is at the unlock position, the plunger 131 allows the restricting member 120 to swing by retracting from the swing locus of the protruding portion 124. Thereby, the turning operation of the switch 42 is permitted. When the plunger 131 is at the lock position, the lock portion 121 can appropriately change the mounting position as long as the position interferes with the restricting member 120.

Figure 8:
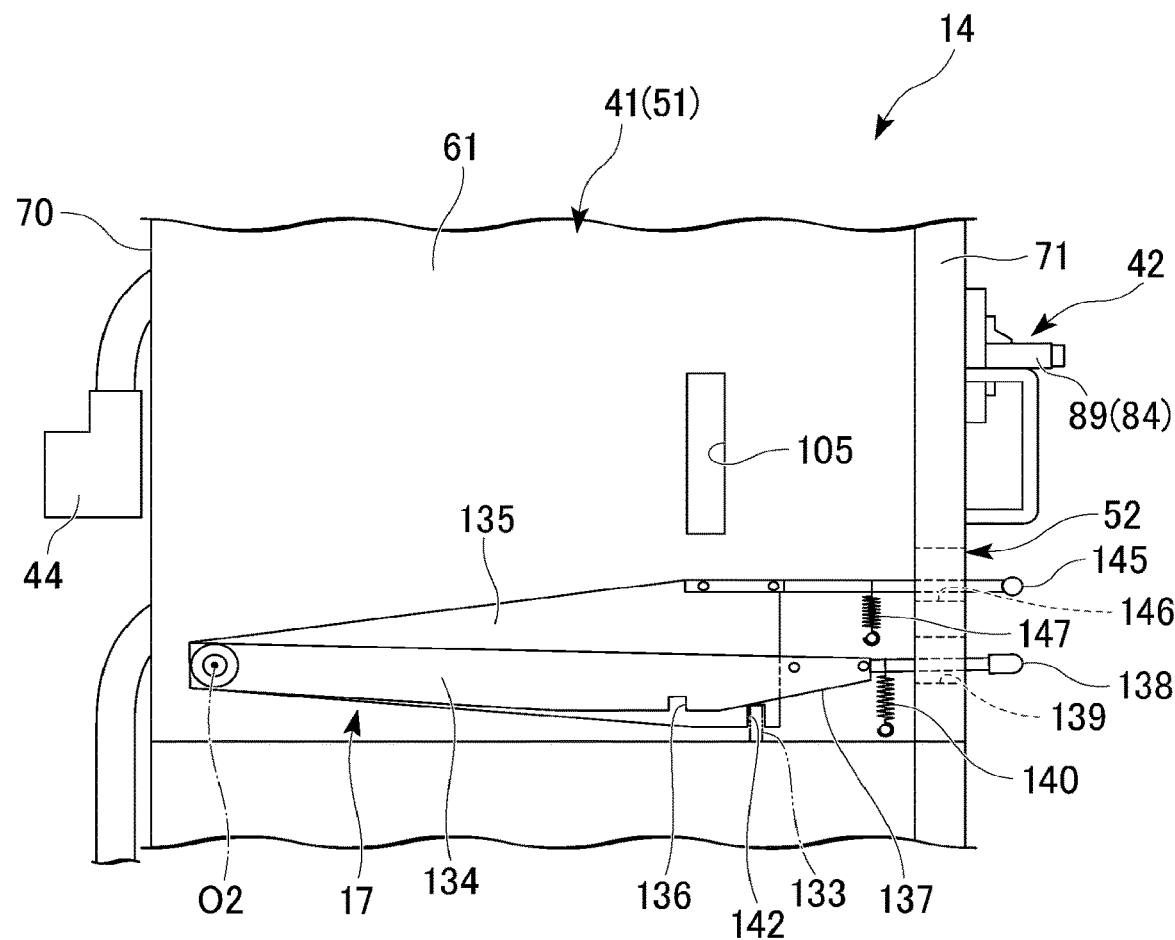
FIG. 8 is a partial side view of the large unit as viewed from the right side.

FIG. 8 is a partial side view of the large unit 14 as viewed from the right side.

Figure 9:
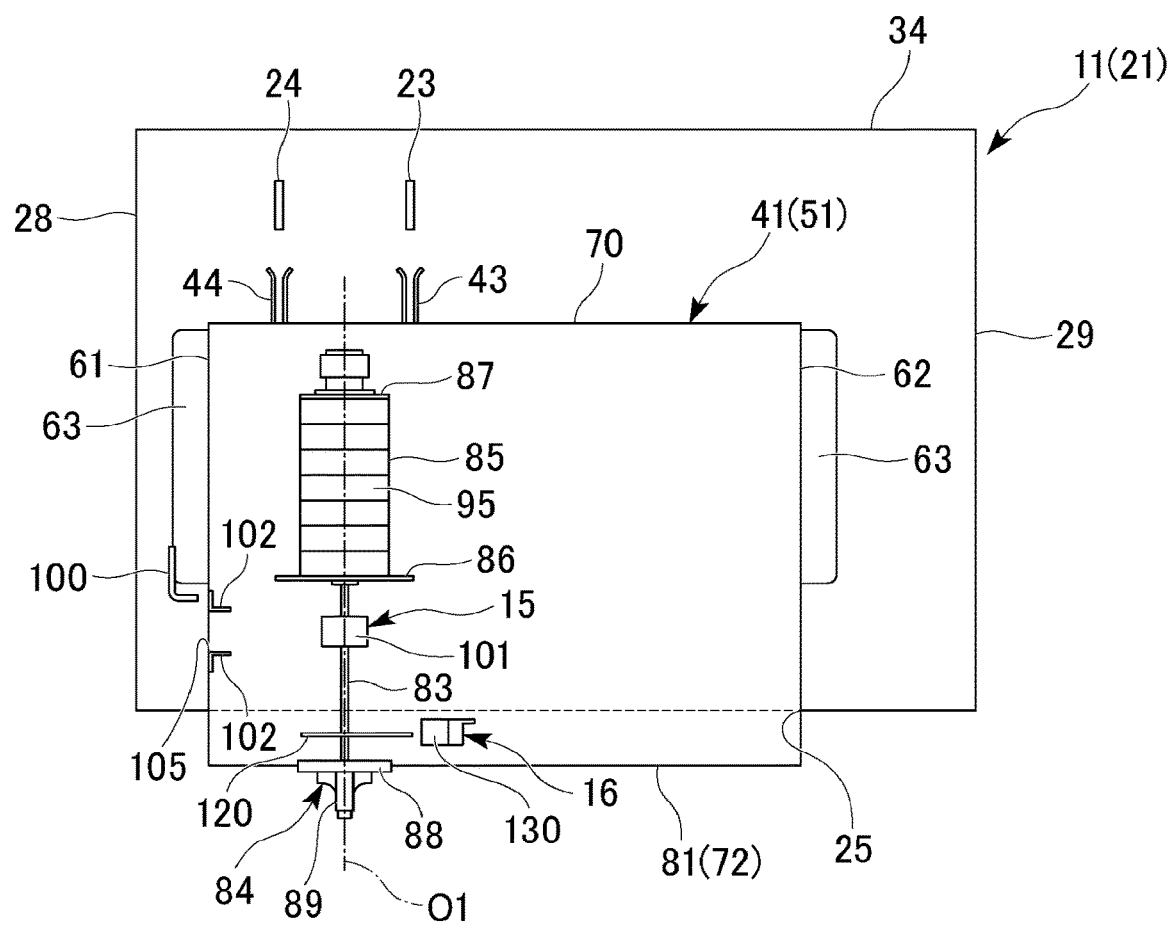
FIG. 9 is a schematic plan view showing a state where the large unit is at a disconnection position.

As shown in FIG. 8, the positioning mechanism 17 positions the large unit 14 relative to the housing 21 in the front-rear direction. The positioning mechanism 17 restricts the front-rear movement of the large unit 14 with respect to the housing 21 when the large unit 14 is at any of the mounting position and the disconnection position. The mounting position is a state in which the terminals 43 and 44 are connected to the bus bars 23 and 24 as described above. On the other hand, as shown in FIGS. 3 and 9, the disconnection position is a state in which the terminals 43, 44 are separated from the bus bars 23, 24, and the front end of the large unit 14 (only the portion corresponding to the bent wall 82) protrudes from the front of the middle unit 13. At the disconnection position, the upper opening of the accommodation portion 51 is not exposed to the outside because the front end of the middle unit 13 located above the large unit 14 is covered from above. A part of the upper opening of the accommodation portion 51 may be exposed to the outside at the disconnection position.

The positioning mechanism 17 includes an engaging portion 133, a first lever 134, and a second lever 135.

The engaging portion 133 is attached to a portion of the housing 21 located below the stopper 100 on the inner surface of the side wall 28 described above. The engagement portion 133 protrudes inward in the left-right direction from the side wall 28. The protruding amount of the distal end of the engaging portion 133 from the side wall 28 has a length that does not interfere with the side wall 61 of the unit housing 41 of the large unit 14 in a front view.

The first lever 134 is supported by the rear end of the side wall 61 so as to be rotatable around a second axis O2 along the left-right direction. The first lever 134 is formed in a plate shape having a thickness direction in the left-right direction. The first lever 134 cantileverly extends forward along the outer surface of the side wall 61. At the front of the first lever 134, a first slit 136 that opens downward is formed. When the large unit 14 is at the disconnection position, the above-described engaging portion 133 is engaged in the first slit 136 (see FIG. 11). Thereby, the movement of the large unit 14 in the front-rear direction with respect to the housing 21 at the disconnection position is restricted. At the disconnection position, it is preferable that the interference member 101 is separated from the stopper 100 forward even when the interference member 101 is at the restricting position (see FIG. 9).

An escape portion 137 is formed in a portion of the first lever 134 located in front of the first slit 136. The escape portion 137 is formed by inclining upward as the lower end edge of the first lever 134 moves forward. That is, in a part of the first lever 134 where the escape portion 137 is formed, the width in the up-down direction gradually decreases toward the front.

At the front end of the first lever 134, a first handle 138 is provided. The first handle 138 extends forward from the first lever 134. The first handle 138 protrudes forward of the large unit 14 through a through hole 139 formed in the door support portion 71. The first lever 134 swings around the second axis O1 by moving the first handle 138 up and down. A first urging member 140 for urging the first lever 134 downward is interposed between the first handle 138 and the side wall 61 behind the door support portion 71. The lowermost position of the first lever 134 is defined by contacting a stopper (not shown). When the first lever 134 is at the lowermost position, the lower edge of the first lever 134 is gradually inclined downward toward the front.

The second lever 135 is rotatably supported on the rear end of the side wall 61 coaxially with the above-described second axis O2. The second lever 135 is formed in a plate shape having a thickness direction in the left-right direction. The second lever 135 extends cantilever forward between the first lever 134 and the side wall 61. The first lever 134 and the second lever 135 need not be arranged coaxially.

A second slit 142 is formed in a portion of the second lever 135 located forward of the first slit 136 described above. The second slit 142 opens downward. The lower end opening edge of the second slit 142 is located lower than the above-described escape portion 137. When the large unit 14 is at the mounting position, the above-described engaging portion 133 is engaged in the second slit 142. Thereby, the movement of the large unit 14 in the front-rear direction with respect to the housing 21 at the mounting position is restricted. When the second lever 135 is at the lowermost position, the lower edge of the second lever 135 is gradually inclined downward toward the front.

At the front end of the second lever 135, a portion located above the first lever 134 is provided with a second handle 145. The second handle 145 extends forward from the second lever 135. The second handle 145 protrudes forward of the large unit 14 through a through hole 146 formed in the door support portion 71. The second lever 135 swings around the second axis O1 by moving the second handle 145 up and down. A second urging member 147 for urging the second lever 135 downward is interposed between the second handle 145 and the side wall 61 behind the door support portion 71. The lowermost position of the second lever 135 is defined by contacting a stopper (not shown).

Next, a method of attaching and detaching the large unit 14 to and from the housing 21 will be described as an operation of the power conversion device 1 according to the present embodiment. First, a method of mounting the large unit 14 will be described.

The slider 32 is pulled out through the opening 25, and the overhang portion 63 of the large unit 14 is fixed to the slider 32. In the present embodiment, all overhang portions 63 are fixed to the corresponding slider 32. At least one set of overhang portions 63 among a plurality of overhang portions 63 arranged in the vertical direction may be fixed to the corresponding slider 32.

Figure 10:
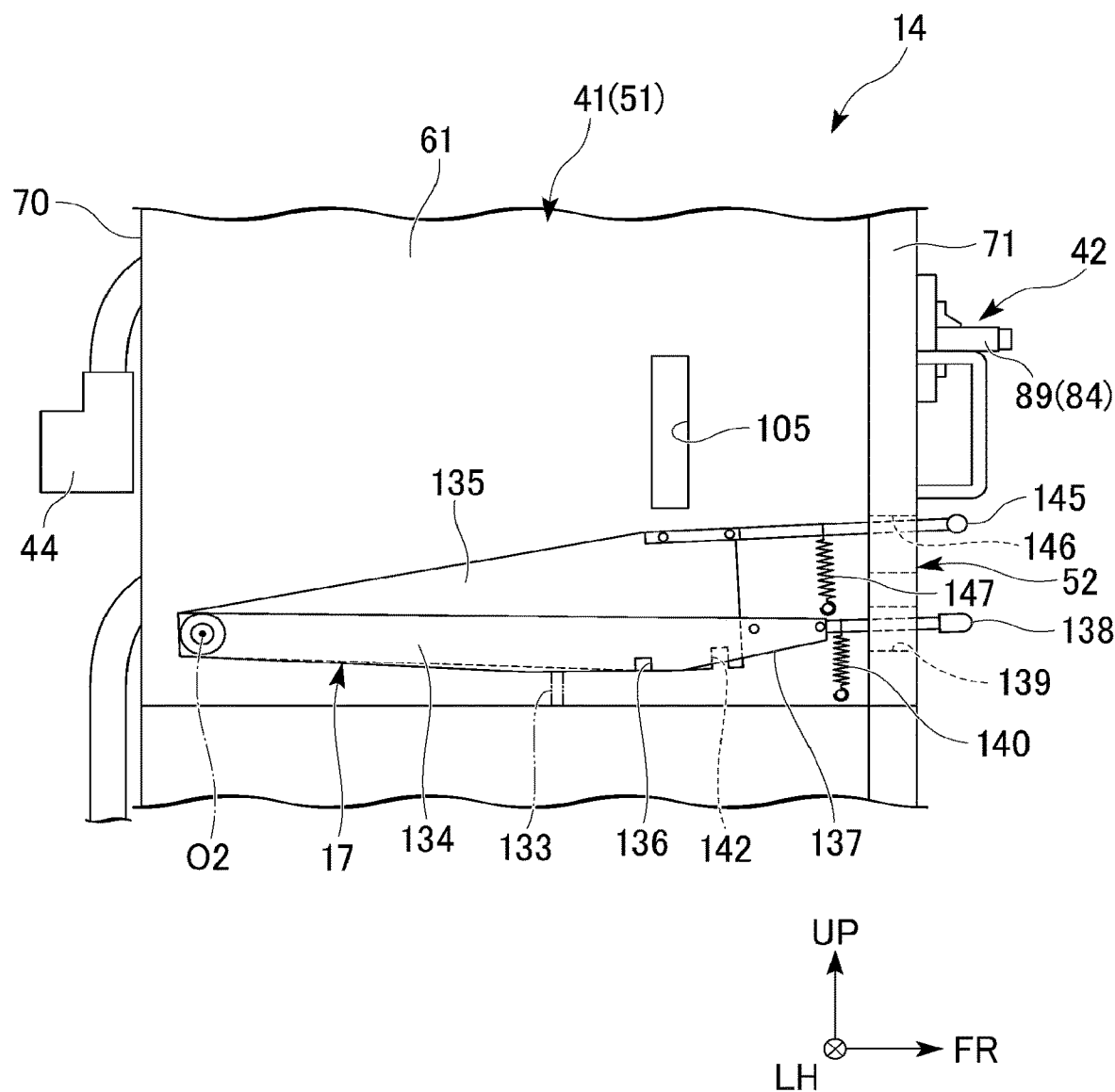
FIG. 10 is a partial side view of the large unit as viewed from the right side.
Figure 11:
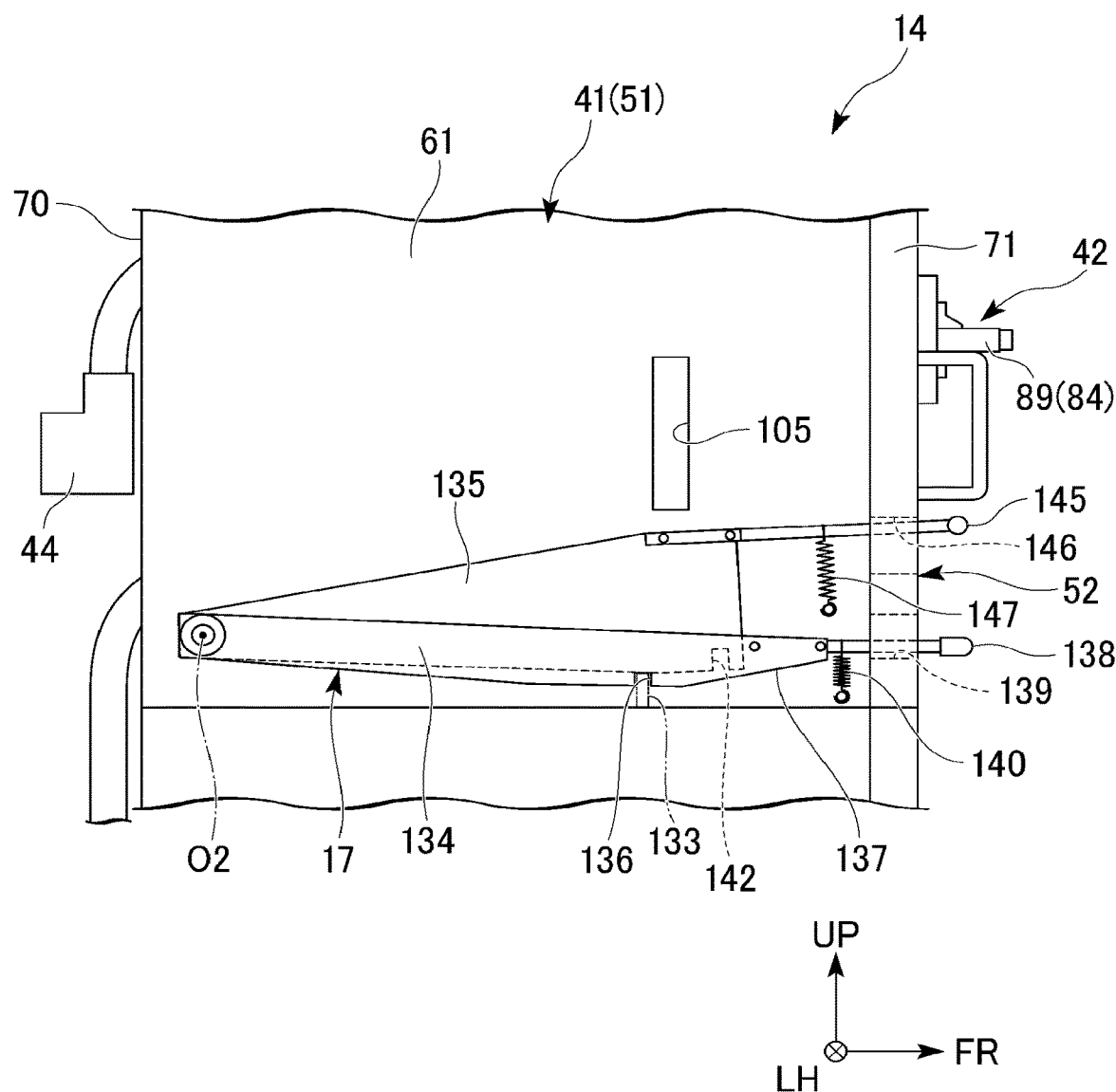
FIG. 11 is a partial side view of the large unit as viewed from the right side.

FIGS. 10 and 11 are partial side views of the large unit 14 as viewed from the right side.

In a state where the switch 42 is in the OFF position, the large unit 14 is pushed rearward. As shown in FIG. 10, the slider 32 moves rearward on the rail 31, so that the large unit 14 enters the housing 21 together with the slider 32. In a state where the large unit 14 enters the housing 21, the engagement portion 133 slides on the lower edge of each of the levers 134 and 135. Accordingly, each of the levers 134 and 135 rotates upward (in a direction against the urging force of the urging members 140 and 147) around the second axis O2 as the large unit 14 moves rearward. Thereby, it is possible to prevent the mounting operation of the large unit 14 from being restricted by the levers 134 and 135.

As shown in FIG. 11, when the large unit 14 reaches the disconnection position, the engagement portion 133 and the first slit 136 overlap in plan view. The first lever 134 rotates downward around the second axis O2 by the urging force of the first urging member 140. Thereby, the engaging portion 133 is engaged in the first slit 136. As a result, the large unit 14 is positioned at the disconnection position. At the disconnection position, as shown in FIG. 9, since the upper opening of the accommodation portion 51 is not exposed to the outside, it is possible to prevent dust and the like from entering the unit housing 41 through the upper opening of the accommodation portion 51.

In order to move the large unit 14 from the disconnection position to the mounting position, the first lever 134 is pulled up via the first handle 138 to release the engagement between the first slit 136 and the engaging portion 133. In this state, the large unit 14 is further pushed rearward. The large unit 14 moves rearward while the second lever 135 is pushed up by the engagement portion 133. The lifting of the first handle 138 may be released after the first slit 136 has passed through the engaging portion 133.

As shown in FIG. 8, when the large unit 14 reaches the mounting position, the engaging portion 133 and the second slit 142 overlap in plan view. The second lever 135 rotates downward around the second axis O2 by the urging force of the second urging member 147. Thereby, the engaging portion 133 is engaged in the second slit 142. As a result, the large unit 14 is positioned at the mounting position. In the mounting position, the terminals 43 and 44 are connected to the bus bars 23 and 24, and the front wall of the unit housing 41 is flush with the front wall of the housing 21.

Subsequently, an operation method of the large unit 14 will be described.

As shown in FIG. 7, in a state where the large unit 14 is in the mounting position, the knob 89 is twisted, and the switch 42 is rotated around the first axis O1, so that the switch 42 is moved to the precharge position. The bus bars 23 and 24 and the precharge circuit are connected via the precharge block among the contact blocks of the switch 42. Thereby, DC power is supplied to the precharge circuit via the bus bars 23 and 24, and the smoothing capacitor is precharged. As a result, the rush power when the switch 42 is turned ON can be reduced.

In the present embodiment, as described above, before the precharge is completed, since the plunger 131 exists on the swing locus of the lock portion 121 (protruding portion 124), the switch 42 cannot rotate to the ON position. Therefore, it is possible to prevent the switch 42 from moving to the ON position without performing precharge.

When the precharge is completed, power is supplied to the coil of the main body portion 130. The plunger 131 is retracted to the unlocked position by the electromagnetic force acting between the coil and the plunger 131. Thereby, the movement of the switch 42 to the ON position is permitted. The switch 42 is rotated about the first axis O1, and the switch 42 is moved to the ON position. Thereby, the contact block of the switch 42 is connected to the main circuit. The DC power supplied to the main circuit via the bus bars 23 and 24 is converted to AC power and then output to the motor. As a result, the motor can be driven.

As shown in FIG. 5, when the switch 42 is at the ON position, the interference member 101 is at the restriction position. That is, the interference member 101 approaches or contacts the second end of the stopper 100 from behind. Therefore, the forward movement of the large unit 14 with respect to the housing 21 is restricted. Thus, it is possible to prevent the large unit 14 from being accidentally pulled out while the switch 42 is in the ON position.

As shown in FIG. 4, when removing the large unit 14 from the housing 21 at the time of maintenance, replacement, or the like, an operation reverse to the mounting method described above is performed. First, the switch 42 is moved to the OFF position. When the interference member 101 moves to the retracting position, the interference member 101 retracts to a position where the interference member 101 does not overlap the stopper 100 in a front view. When the switch 42 is moved to the OFF position (other than the ON position), power supply to the coil of the main body portion 130 is stopped. As a result, the plunger 131 moves to the lock position.

As shown in FIGS. 8, 10, and 11, the second lever 135 is pulled up via the second handle 145, and the engagement between the second slit 142 and the engagement portion 133 is released. In this state, the large unit 14 is pulled out forward. The slider 32 moves forward on the rail 31, so that the large unit 14 moves forward with the slider 32. When the large unit 14 reaches the disconnection position, the engaging portion 133 is engaged in the first slit 136. Thereby, the large unit 14 is positioned at the disconnection position. In a state where the first lever 134 is pulled up via the first handle 138 and the engagement between the first slit 136 and the engaging portion 133 is released, the large unit 14 is further pulled forward. Thereby, the large unit 14 is removed from the housing 21.

Figure 12:
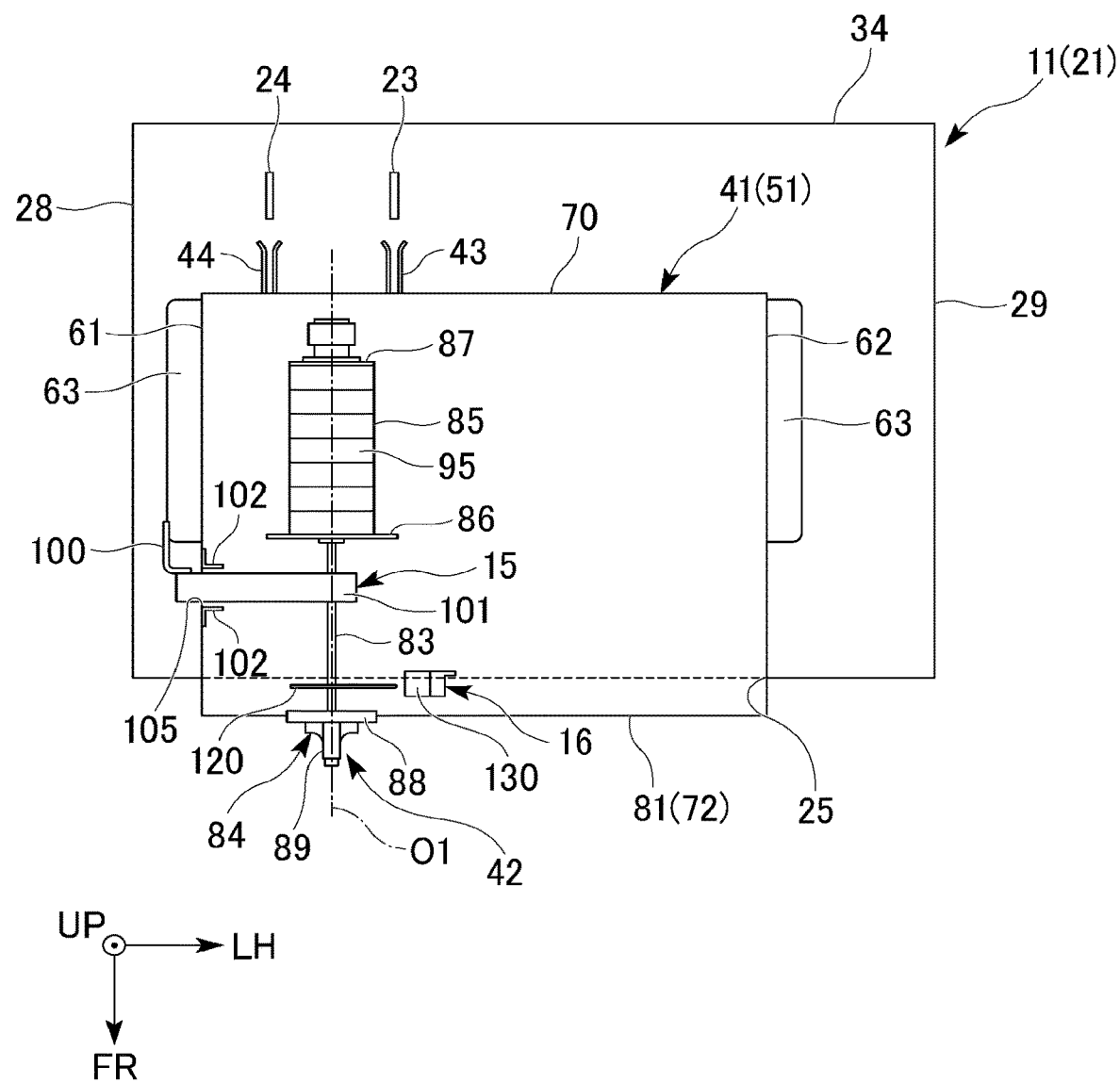
FIG. 12 is a schematic plan view of a large unit for describing incorrect mounting suppression.

FIG. 12 is a schematic plan view of the large unit 14 for describing incorrect mounting suppression.

In addition, as shown in FIG. 12, when the switch 42 is in the ON position even though the large unit 14 is not in the mounting position, the interference member 101 is disposed in the restriction position. That is, the interference member 101 protrudes outside the unit housing 41 through the communication hole 105. Therefore, when the large unit 14 is to be mounted on the housing 21, the interference member 101 collides with the stopper 100 from the front before the large unit 14 reaches the disconnection position, so that the rearward movement of the large unit 14 with respect to the housing 21 is restricted. Thereby, it is possible to prevent the large unit 14 from moving to the mounting position while the switch 42 is in the ON position. The interference member 101 may be configured to contact the stopper 100 between the disconnection position and the mounting position.

As described above, in the present embodiment, a configuration is adopted in which the incorrect mounting suppressing mechanism 15 is provided so that, when the switch 42 is in the ON position, the stopper 100 and the interference member 101 overlap in front view, and when the switch 42 is in the OFF position, the interference member 101 retracts from the stopper 100 in front view.

According to this configuration, when the large unit 14 is to be mounted on the housing 21 in a state where the interference member 101 is in the restricting position, the interference member 101 comes into contact with the stopper 100, so that movement of the large unit 14 to the mounting position with respect to the housing 21 is restricted. Thereby, it is possible to suppress the large unit 14 from being mounted on the housing 21 with the switch 42 in the ON position (so-called incorrect mounting). As a result, it is possible to suppress the failure of the large unit 14 due to, for example, supplying power to the main circuit without performing precharge.

In the present embodiment, by moving the interference member 101 in synchronization with the operation of the switch 42, the interference member 101 can be positioned at an optimal position according to the state of the switch 42.

In the present embodiment, a configuration is adopted in which the interference member 101 moves around the first axis O1 between the restricting position and the retracting position in synchronization with the movement of the switch 42 around the first axis O1 between the ON position and the OFF position.

According to this configuration, since the interference member 101 swings between the restricting position and the retracting position, the layout of the peripheral members can be improved as compared with, for example, sliding movement, and it is possible to downsize the large unit 14, or the like.

In the present embodiment, a configuration is adopted in which the reinforcing portion 102 for guiding the movement of the interference member 101 is provided at the opening edge of the communication hole 105.

According to this configuration, in a state where the interference member 101 is at the restricting position, the reinforcing portions 102 are arranged on both front and rear sides with respect to the interference member 101. Thereby, for example, when the large unit 14 is forcibly pulled out of the mounting position, or when the large unit 14 is forcibly pushed into the mounting position, the load acting on the interference member 101 via the stopper 100 can be supported by the reinforcing portion 102. Thereby, damage to the interference member 101 and the like can be suppressed. In addition, by reinforcing only the opening edge of the communication hole 105 with the reinforcing portion 102, it is possible to reduce the size and weight as compared with the case where the entire accommodation portion 51 is reinforced.

Moreover, since the reinforcing portion 102 is arranged at the opening edge of the communication hole 105, the reinforcing portion 102 functions as a guide when the interference member 101 swings between the retracting position and the restricting position. Thereby, it is possible to prevent the operation of the switch 42 from being hindered by the interference member 101 coming into contact with the opening edge of the communication hole 105 or the like.

In the present embodiment, a configuration is adopted in which the incorrect operation suppressing mechanism 16 is provided configured to restrict the movement of the switch 42 from the precharge position to the ON position before the precharge is completed, and to allow the movement of the switch 42 from the precharge position to the ON position after the precharge is completed.

According to this configuration, it is possible to more reliably suppress the supply of power to the main circuit without performing the precharge, and to prevent the large unit 14 from being damaged. In addition, since the interference member 101 does not move to the restricting position in a state where the precharge is not completed, it is possible to recognize that an incorrect operation is performed when the switch 42 is operated. As a result, the incorrect mounting described above can be suppressed.

According to at least one embodiment described above, the power conversion device of the embodiment has a housing, an inverter module, and an incorrect mounting suppressing mechanism. The housing has an opening that opens in the first direction, and a bus bar is routed inside. The inverter module is configured to be detachable from the housing through the opening, and has a terminal connected to the bus bar at a mounting position mounted on the housing. The incorrect mounting suppressing mechanism is provided in the housing and the inverter module, and restricts movement of the inverter module in the first direction with respect to the housing. The inverter module has a switch that moves between an OFF position at which a connection between the bus bar and the terminal can be cut off and an ON position at which a connection between the bus bar and the terminal can be made. The incorrect mounting suppressing mechanism has a stopper and an interference member. The stopper is provided on the housing. The interference member is connected to the switch, and moves between the restriction position and the retracting position as the switch moves. The restriction position overlaps the stopper when viewed from the first direction when the switch is in the ON position. The retracting position retracts from the stopper when viewed from the first direction when the switch is in the OFF position.

According to such a configuration, incorrect mounting can be suppressed.

In the above-described embodiment, the switch 42 is configured to be rotatable around the first axis O1, but the configuration is not limited to this configuration. The switch 42 may be configured to be slidable, for example. In this case, the interference member 101 and the lock portion 121 may also be configured to slide with the sliding movement of the switch 42.

In the above-described embodiment, the configuration in which the large unit 14 includes the incorrect mounting suppressing mechanism 15, the incorrect operation suppressing mechanism 16, and the positioning mechanism 17 has been described, but the configuration is not limited to this configuration. The large unit 14 only needs to include at least the incorrect mounting suppressing mechanism 15.

In the embodiment described above, the configuration in which the incorrect mounting suppressing mechanism 15 is mounted on the large unit 14 is described as an example, but the configuration is not limited to this configuration. The same configuration as the large unit 14 may be mounted on the small unit 12 and the middle unit 13.

In the above-described embodiment, the configuration in which the inverter units 12 to 14 are inserted and removed in the front-rear direction (first direction) with respect to the housing 21 has been described, but the present invention is not limited to this configuration. The inverter units 12 to 14 may be configured to be inserted into and removed from the housing 21 in the vertical direction (first direction).

In the above-described embodiment, the configuration in which the incorrect mounting suppressing mechanism 15 is provided between the side walls 28 and 61 has been described, but the present invention is not limited to this configuration. For example, the incorrect mounting suppressing mechanism 15 may be provided between the side walls 29 and 62 and between the rear walls 34 and 98. That is, the stopper 100 and the interference member 101 only need to be able to restrict and release the movement of the large unit 14 with respect to the housing 21 by overlapping or retracting in a front view.

Although several embodiments of the present invention have been described, these embodiments are provided by way of example and are not intended to limit the scope of the invention. These embodiments can be implemented in other various forms, and various omissions, replacements, and changes can be made without departing from the spirit of the invention. These embodiments and their modifications are included in the scope and gist of the invention, and are also included in the invention described in the claims and equivalents thereof.

REFERENCE SIGNS LIST

1: Power conversion device, 12-14: Inverter unit, 15: Incorrect mounting suppressing mechanism, 16: Incorrect operation suppressing mechanism, 21: Housing, 23: Bus bar, 24: Bus bar, 25: Opening, 42: Switch, 43: Terminal, 44: Terminal, 51: Accommodation portion, 100: Stopper, 101: Interference member, 102: Reinforcing portion, 105: Communication hole, 120: Restricting member, 121: Lock portion

The invention claimed is:

1. A power conversion device comprising:
 a housing that has an opening that opens in a first direction and a bus bar arranged therein;
 an inverter module configured to be detachable from the housing through the opening, and that has a terminal connected to the bus bar at a mounting position mounted on the housing;
 an incorrect mounting suppressing mechanism provided on the housing and the inverter module, and configured to restrict movement of the inverter module in the first direction with respect to the housing,
 wherein the inverter module includes:
  a switch that moves between an OFF position at which a connection between the bus bar and the terminal can be cut off, and an ON position at which the connection between the bus bar and the terminal can be made, and
  an accommodation portion configured to accommodate the switch,
 wherein the incorrect mounting suppressing mechanism includes:
  a stopper provided on the housing, and
  an interference member connected to the switch and configured to move with a movement of the switch between a restricting position overlapping the stopper when viewed from the first direction in a state where the switch is in the ON position, and a retracting position retracting from the stopper when viewed from the first direction in a state where the switch is in the OFF position;
 a communication hole that communicates inside and outside of the accommodation portion is formed in a portion of the accommodation portion that is located on a movement locus of the interference member; and
 a portion facing the first direction in an opening edge of the communication hole is provided with a reinforcing portion extending toward inside of the accommodation portion.

2. The power conversion device according to claim 1, wherein
 the switch is configured to be rotatable around an axis along the first direction between the ON position and the OFF position, and
 the interference member is configured to move around the axis between the restriction position and the retracting position with a rotation of the switch.

3. A power conversion device comprising:
 a housing that has an opening that opens in a first direction and a bus bar arranged therein;
 an inverter module configured to be detachable from the housing through the opening, and that has a terminal connected to the bus bar at a mounting position mounted on the housing;
 an incorrect mounting suppressing mechanism provided on the housing and the inverter module, and configured to restrict movement of the inverter module in the first direction with respect to the housing,
 wherein the inverter module includes a switch that moves between an OFF position at which a connection between the bus bar and the terminal can be cut off, and an ON position at which the connection between the bus bar and the terminal can be made,
 wherein the incorrect mounting suppressing mechanism includes:

a stopper provided on the housing, and an interference member connected to the switch and configured to move with a movement of the switch between a restricting position overlapping the stopper when viewed from the first direction in a state where the switch is in the ON position, and a retracting position retracting from the stopper when viewed from the first direction in a state where the switch is in the OFF position, wherein the switch is configured to be movable between a precharge position for performing a precharge of a capacitor between the OFF position and the ON position, wherein the inverter module includes an incorrect operation suppressing mechanism that restricts movement of the switch from the precharge position to the ON position in a state before the precharge is completed, and allows movement of the switch from the precharge position to the ON position in a state after the precharge is completed, and wherein the incorrect operation suppressing mechanism includes:

a lock portion provided on the switch, and configured to be movable with the movement of the switch, and a restricting member configured to be capable of moving forward and rearward with respect to a movement locus of the lock portion.

* * * * *